US008392495B2

(12) United States Patent
Morgan

(10) Patent No.: US 8,392,495 B2
(45) Date of Patent: Mar. 5, 2013

(54) REFLECTIONLESS FILTERS

(75) Inventor: Matthew Alexander Morgan, Earlysville, VA (US)

(73) Assignee: Associated Universities, Inc., Washington, DC (US)

( * ) Notice: Subject to any disclaimer, the term of this patent is extended or adjusted under 35 U.S.C. 154(b) by 946 days.

(21) Appl. No.: 12/476,883

(22) Filed: Jun. 2, 2009

(65) Prior Publication Data

US 2010/0205233 A1    Aug. 12, 2010

Related U.S. Application Data

(60) Provisional application No. 61/150,868, filed on Feb. 9, 2009.

(51) Int. Cl.
*G06G 7/02* (2006.01)
(52) U.S. Cl. ....................................................... 708/819
(58) Field of Classification Search .................. 708/819; 333/202
See application file for complete search history.

(56) References Cited

U.S. PATENT DOCUMENTS

| 3,514,722 | A | | 5/1970 | Cappucci |
| 3,605,044 | A | | 9/1971 | Seidel |
| 3,748,601 | A | * | 7/1973 | Seidel ............................ 333/109 |
| 3,869,585 | A | * | 3/1975 | Snyder ........................... 333/118 |
| 2007/0152750 | A1 | | 7/2007 | Anderson et al. |
| 2008/0297284 | A1 | | 12/2008 | Ishii et al. |
| 2012/0023059 | A1 | | 1/2012 | Morgan |

OTHER PUBLICATIONS

Search Report for PCT/US10/22507 dated Mar. 23, 2010.
Patentability Report for PCT/US10/22507 Aug. 9, 2011.

* cited by examiner

*Primary Examiner* — Tan V. Mai
(74) *Attorney, Agent, or Firm* — Remenick PLLC

(57) ABSTRACT

Reflectionless low-pass, high-pass, band-pass, and band-stop filters, as well as a method for designing such filters is disclosed. The filters function by absorbing the stop-band portion of the spectrum rather than reflecting it back to the source, which has significant advantages in many different applications.

41 Claims, 9 Drawing Sheets

REFLECTIONLESS FILTERS

REFERENCE TO RELATED APPLICATIONS

This application claims priority to U.S. Provisional Application No. 61/150,868 entitled "Reflectionless Filters" filed Feb. 9, 2009, the entirety of which is hereby specifically incorporated by reference.

RIGHTS IN THE INVENTION

This invention was made with government support under Cooperative Agreement AST-0223851, between the National Science Foundation and Associated Universities, Inc., and, accordingly, the United States government has certain rights in this invention.

BACKGROUND

1. Field

The invention is directed toward electronic filters and methods of their use. Specifically, the invention is directed toward reflectionless electronic filters and methods of their use.

2. Background

Filters are ubiquitous components in virtually all electronic systems, from communications to radio astronomy, and arguably the fundamental principles of filter theory and optimization have been well known for the better part of a century. Nonetheless, practical filter design and implementation remains one of the most active fields of study in the electronics community today. However, reflectionless filters, in which the stop-band portion of the spectrum is absorbed rather than reflected back to the source, largely have been overlooked.

Standard reflective filters cause numerous problems in many applications, including: (1) sensitivity of mixer performance to out-of-band port terminations, (2) potential instability of integrated amplifiers with high out-of-band gain, (3) detrimental or unpredictable nonlinear effects resulting from reactive harmonic loading, (4) potential damage to high-power transmitters with large harmonic content, and (5) leakage, interference, or cross-talk resulting from trapped energy between the filter and another poorly matched component coupling into the enclosure cavity.

There are many practical situations in which the reactive termination presented by a conventional filter in its stop-band adversely affects the system performance. Mixers, for example, can be extremely sensitive to the out-of-band terminations present on any of their ports, which is precisely where a filter is most likely to be in many heterodyne applications. Wideband system designers have learned to work around this problem by routinely inserting fixed attenuators in the signal path near the mixer. Similarly, high gain amplifiers, though they may be unconditionally stable in a test fixture, can easily develop instability in a packaged environment where unintended feedback is combined with a reactive out-of-band termination on its input or output. Again, a filter is often used adjacent to the amplifier to better define the bandwidth of the system, and the stop-band impedance of the filter may need to be padded with attenuators to avoid causing stability problems.

One conventional approach to making a filter that is matched in both the pass- and stop-bands is to design a diplexer (or multiplexer) using two or more filters with complementary susceptance curves derived from singly loaded (reflective) prototypes, and terminating all but one of these filters with a matched load. This is a fairly complex procedure, requiring at least double the number of distinct elements as a conventional filter of the same order, and would be matched on only one of the two ports. An alternative design is to make a directional filter using two quadrature hybrids in a balanced configuration, or by using a directional coupling structure. However, quadrature hybrids with sufficient bandwidth can be difficult to design, and the intrinsically directional filter structures do not lend themselves to high-order implementations.

Therefore, it would be desirable to have a reflectionless filter that does not reflect signals in its stop-band back to the source. Further, it would be desirable to have a reflectionless filter that is well-matched at all frequencies, and on both ports.

SUMMARY

The present invention addresses several of the problems and disadvantages associated with conventional filters and provides a new resource for band selection and definition in electronic systems.

Embodiments of the invention are directed to reflectionless filters. The filter can be a symmetric two-port circuit including at least one essentially lossless element, and at least one essentially lossy element. The symmetric circuit can be bisected along the line of symmetry and established using even-mode and odd-mode equivalent circuits when the ports are driven in phase and 180° out of phase, respectively. Furthermore, for a chosen normalizing impedance, the normalized input impedance of the even-mode equivalent circuit can be essentially equal to the normalized input admittance of the odd-mode equivalent circuit.

The filter can have least one lossless element that is one of an inductor, a capacitor, a varactor, a resonator, and a transmission line and/or at least one lossy element that can be a resistor. In certain embodiments, at least one of the circuit elements can be tunable.

The filter can be a low-pass filter, a high-pass filter, a band-pass filter, or a band-stop filter. The filter can also include at least one shunt element between the circuit nodes and the line of symmetry. The filter can be a first-, a second- or a higher-order filter.

In certain embodiments, all of the inductors are of equal value, and all of the capacitors are of equal value. Furthermore all of the resistors can be of equal value.

In certain embodiments the filter is one of a band-pass filter and a band-stop filter, and all of the resistors are of equal value, all of the inductors are one of two values, and all of the capacitors are one of two values.

In certain embodiments, the filter is one of a low-pass filter and a high-pass filter, and $$L = \frac{Z_0}{\omega_p}$$

$$C = \frac{Y_0}{\omega_p}$$

$$R = Z_0$$

wherein L is the inductance of all inductors, C is the capacitance of all capacitors, R is the resistance of all resistors, $\omega_p$ is the pole frequency in radians/s, $Y_0$ is the normalizing admittance, and $Z_0$ is the normalizing impedance.

In other embodiments, the filter is one of a band-pass filter and a band-stop filter, has a first pole and a second pole and $$L_s = \frac{Z_0}{\omega_s}$$

$$L_x = \frac{Z_0}{\omega_x}$$

$$C_s = \frac{Y_0}{\omega_s}$$

$$C_x = \frac{Y_0}{\omega_x}$$

$$R = Z_0$$

wherein the inductance of the inductors is one of $L_x$ and $L_s$, the capacitance of the capacitors is one of $C_x$ and $C_s$, the resistance of the resistors is R, $Y_0$ is the normalizing admittance, $Z_0$ is the normalizing impedance, and $$\omega_s = \omega_{p,2} - \omega_{p,1}$$

$$\omega_x = \frac{\omega_{p,1}\omega_{p,2}}{\omega_{p,2} - \omega_{p,1}}$$

wherein $\omega_{p,1}$ and $\omega_{p,2}$ are the first and second pole frequencies, respectively.

In certain embodiments, the two symmetric halves of the circuit can include: a port node, a first internal node, a second internal node, a lossless element of a first type connecting the port node to a node on the line of symmetry, a lossless element of a second type connecting the port node to the first internal mode, a lossless element of the first type connecting the first internal node to ground, a lossy element connecting the first internal node to the second internal node, a lossless element of the second type connecting the second internal node to ground, and a direct connection between the second internal node and a node on the line of symmetry.

The lossy element can be a resistor. The lossless element of the first type can be an inductor, while the lossless element of the second type can be a capacitor or vice-versa. In other embodiments, the lossless element of the first type is an inductor and capacitor in parallel and the lossless element of the second type is an inductor and capacitor in series. While in yet other embodiments, the lossless element of the first type is an inductor and capacitor in series and the lossless element of the second type is an inductor and capacitor in parallel.

In certain embodiments, a number of reflectionless filters are cascaded. The poles of the cascaded filters can be either coincident or distributed. The filter can be derived by scaling or transformation of another reflectionless filter. The circuit elements can be transmission-line equivalents or approximants of lumped elements, and/or transistor-circuit equivalents or approximants of lumped elements. In certain embodiments, the transistors are either Field Effect or Bipolar. In other embodiments, the transistors are either CMOS or BiCMOS.

In certain embodiments, at least one circuit element can be a diode or a tunnel junction. The physical medium of the circuit elements can be one of coaxial, waveguide, leaded, surface mount, and monolithically-integrated. In certain embodiments, at least one circuit element is superconducting.

Other embodiments of the invention are directed to an assembly that includes the reflectionless filter of this invention. In certain embodiments of the assembly, the filter is cascaded with other reflectionless filters, with an amplifier, with a mixer, a detector, and/or a conventional filter. The assembly can be a gain block, a tunable filter, a filter bank, a multiplexer, a signal source, an upconverter or downconverter, a transmitter, a receiver, or a transceiver.

Other embodiments of the invention are directed toward a method of designing reflectionless filters. The steps of the invention include: constraining a circuit to be symmetric; choosing a normalizing impedance; and constraining the normalized input impedance of the even-mode equivalent circuit to be essentially equal to the normalized input admittance of the odd-mode equivalent circuit.

The method also can include: constraining the even-mode equivalent circuit topology to be one of the group of filters including high-pass, low-pass, band-pass, and band-stop, wherein one port is terminated; constraining the odd-mode equivalent circuit topology to be the dual of the even-mode circuit topology; adjusting the even- and odd-mode circuit topologies to satisfy symmetry conditions while maintaining the circuit behavior; and constraining the values of the circuit elements to also satisfy symmetry, and duality conditions.

Certain embodiments also can include adding new elements between the circuit nodes and nodes on the line of symmetry, assigning values to the circuit elements that result in at least one transmission pole at a desired location, cascading a plurality of reflectionless filters, and/or setting the pole locations to be one of coincident and distributed.

Certain embodiments can also include selecting physical components that closely approximate the circuit behavior of the circuit elements in the reflectionless filter topology. The physical components can be one of lumped-elements, transmission lines, and transistors. Furthermore, the physical components can be one of coaxial, waveguide, leaded, surface-mount, and monolithically-integrated.

Other embodiments and advantages of the invention are set forth in part in the description, which follows, and in part, may be obvious from this description, or may be learned from the practice of the invention.

DESCRIPTION OF THE DRAWINGS

The invention is described in greater detail by way of example only and with reference to the attached drawings, in which.

DETAILED DESCRIPTION

As embodied and broadly described herein, the disclosures herein provide detailed embodiments of the invention. However, the disclosed embodiments are merely exemplary of the invention that can be embodied in various and alternative forms. Therefore, there is no intent that specific structural and functional details should be limiting, but rather the intention is that they provide a basis for the claims and as a representative basis for teaching one skilled in the art to variously employ the present invention.

A problem in the art capable of being solved by the embodiments of the present invention is a circuit topology and design technique for electronic filters that are well-matched at all frequencies. It has been surprisingly discovered that such filters have a number of unexpected advantages, including minimal reflections on their input and output ports, either in their pass bands or stop bands, or the transition bands. The return loss for these filters is substantially infinite at all frequencies. In conventional filters, on the other hand, stop band rejection is achieved by reflecting the unwanted portion of the spectrum back toward the signal source rather than absorbing it. The instant filters are comprised of lumped element resistors, inductors, and capacitors, or of transmission line equivalents, and can be implemented in whatever form is suited to the application (e.g. waveguide, coaxial, wire-leaded, surface-mount, monolithically-integrated).

Figure 1:
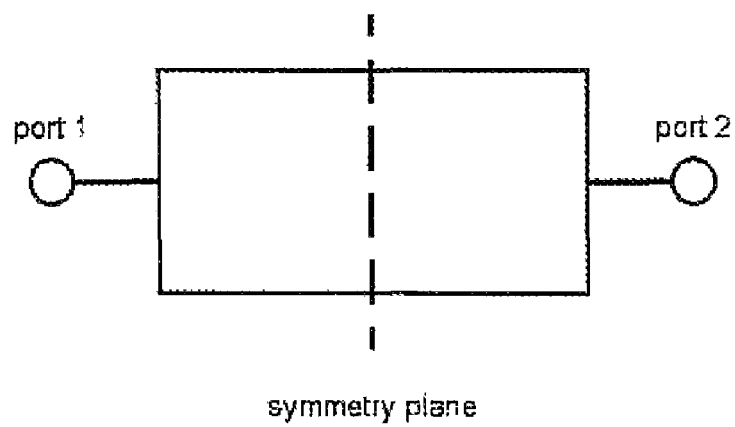
FIG. 1 is a block diagram of a symmetric two-port network.

FIG. 1 depicts an arbitrary, symmetric, two-port network. While symmetry is not required of reflectionless filters, the preferred embodiment is symmetrical. In such a network, if both ports are excited simultaneously with equal signal amplitudes and matching phase, there will be no currents crossing from one side of the symmetry plane to the other. This is called the even-mode. Similarly, if the two ports are excited with equal amplitudes but 180° out of phase, then all nodes that lie on the symmetry plane should have zero electric potential with respect to ground. This is called the odd-mode.

Therefore, it is possible to have two single-port networks, each containing one half of the elements of the original two-port network, where the nodes that lie on the symmetry plane are either open-circuited or shorted to ground. These can be called the even-mode equivalent circuit and the odd-mode equivalent circuit, respectively. Equivalent circuits are circuits that retain all of the electrical characteristics of the original (and often more complex) circuits. The scattering parameters of the original two-port network are then given as the superposition of the reflection coefficients of the even- and odd-mode equivalent circuits, as follows:

$$s_{11} = s_{22} = \frac{1}{2}(\Gamma_{even} + \Gamma_{odd}) \quad (1)$$

$$s_{21} = s_{12} = \frac{1}{2}(\Gamma_{even} - \Gamma_{odd}) \quad (2)$$

wherein $s_{ij}$ is the scattering coefficient from port j to port i, and $\Gamma_{even}$ and $\Gamma_{odd}$ are the reflection coefficients of the even- and odd-mode equivalent circuits, respectively. Thus, the condition for perfect input match, $s_{11}=0$, is derived from (1) as follows:

$$\Gamma_{even} = -\Gamma_{odd} \quad (3)$$

This is equivalent to saying that the normalized even-mode input impedance is equal to the normalized odd-mode input admittance (or vice-versa):

$$z_{even} = y_{odd} \quad (4)$$

wherein $z_{even}$ is the normalized even-mode impedance, and $y_{odd}$ is the normalized odd-mode admittance, which is satisfied if the even- and odd-mode circuits are duals of each other (e.g. inductors are replaced with capacitors, shunt elements with series elements). Further, by combining (2) and (3), the transfer function of the original two-port network is given directly by the even-mode reflection coefficient:

$$s_{21} = \Gamma_{even} \quad (5)$$

In practice, mathematically perfect input match is an unobtainable ideal. Additionally, in some applications it can be advantageous to intentionally permit a small amount of degradation of the input match in favor of other filter characteristics, such as cutoff steepness. In such cases, equations (3), (4), and (5) will only hold approximately true.

Using equations (4) and (5) topologies for a reflectionless low-pass filter, a reflectionless high-pass filter, a reflectionless band-pass filter, and a reflectionless band-stop filter can all be derived. For ease of description, the derivation of a low-pass filter is described; however a similar procedure can be followed by one of skill in the art to derive a reflectionless high-pass filter, a reflectionless band-pass filter, and a reflectionless band-stop filter.

Figure 2:
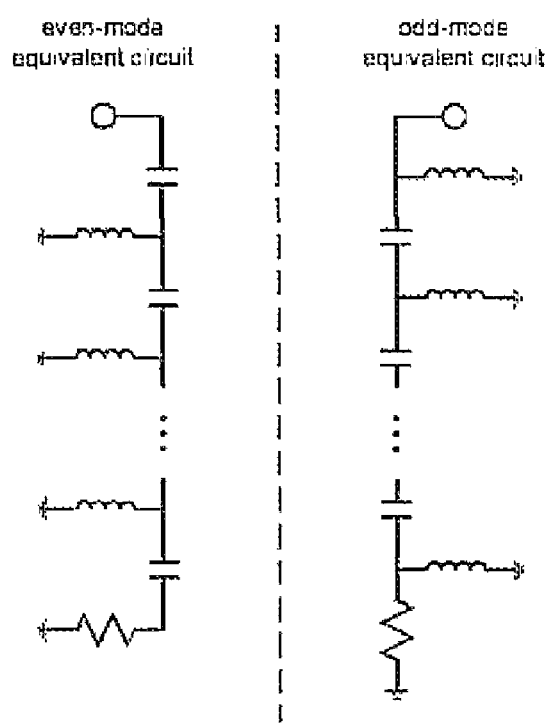
FIG. 2 is a schematic diagram of a pair of dual high-pass circuits used in the derivation of a reflectionless low-pass filter.

FIG. 2 shows dual high-pass circuits. The left hand side of FIG. 2 shows a high-pass filter with one end terminated in the even-mode circuit. Since the transmission characteristic of this even-mode filter is high-pass, the reflection characteristic can be low-pass, and thus the completed two-port can also be low-pass. The dual of this network is shown on the right band side of FIG. 2 as the odd-mode equivalent circuit.

The circuits shown in FIG. 2 may not appear to be the even- and odd-mode components of the two-port network shown in FIG. 1, because they do not appear to satisfy the symmetry condition. However, the symmetry can be restored by making topological modifications that do not affect the circuit behavior. For example, such steps are illustrated in FIG. 3.

Figure 3:
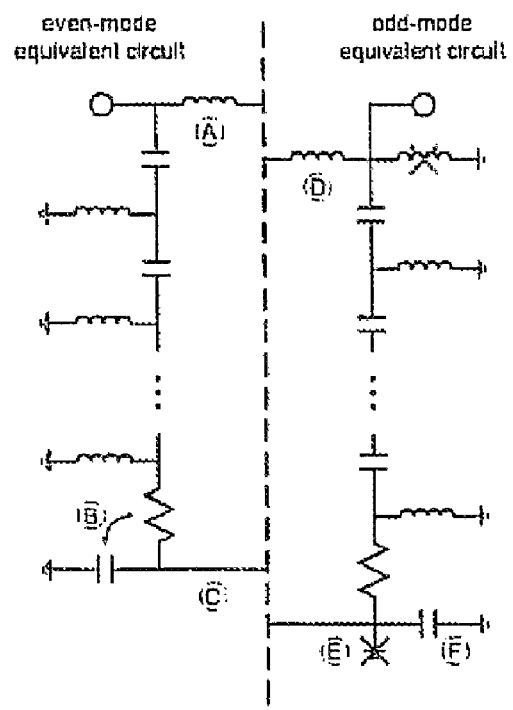
FIG. 3 is a schematic diagram of a pair of dual high-pass circuits after modification to satisfy the symmetry condition.

The steps shown in FIG. 3 include (and not necessarily in this order):

A) Add an inductor between the input node of the even-mode circuit and the symmetry plane. Since the symmetry plane equates to an open circuit in the even-mode, this inductor has no effect.

B) Reverse the order of the capacitor and the resistor, which are in series, at the end of the even-mode circuit.

C) Draw a direct connection from the node between the capacitor and resistor in step B) to the symmetry plane.

This becomes an open circuit in the even-mode and has no effect on the circuit behavior.

D) Change the grounding of the first shunt inductor in the odd-mode circuit from absolute ground to virtual ground (which is defined in the odd-mode by the symmetry plane).

E) Change the grounding of the output resistor in the odd-mode circuit from absolute ground to virtual ground.

F) Add a capacitor between the absolute ground and virtual ground in the odd-mode circuit. Since both ends are grounded, it has no effect on the circuit behavior.

Figure 4:
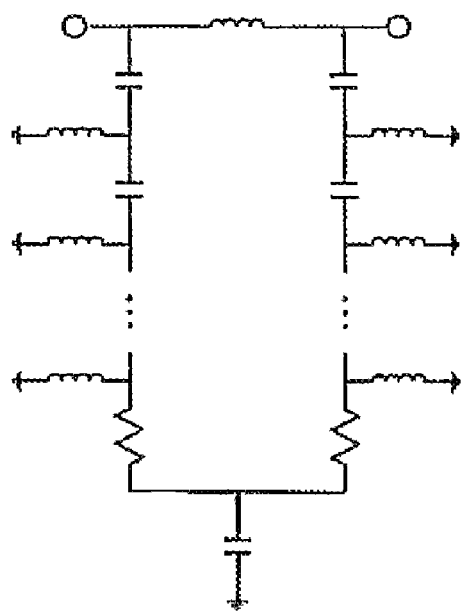
FIG. 4 is a schematic diagram of a reflectionless low-pass filter of arbitrary order.

FIG. 4 shows an embodiment of a resulting reflectionless low-pass filter topology.

Symmetry indicates that the particular values assigned to the inductors and capacitors should be equivalent on both sides while simultaneously satisfying the duality conditions implied by FIG. 2. Additionally flexibility can be obtained by adding shunt elements between the circuit nodes and the symmetry plane, which maintain the symmetry and have no effect on the even-mode circuit but provide an extra degree of freedom to the odd-mode circuit values. Similarly, elements of any type can be added in series with the final capacitor, and then balanced by the dual component across the symmetry plane just before the resistors. Both of these operations preserve the symmetry and allow duality constraints to be met.

Figure 5:
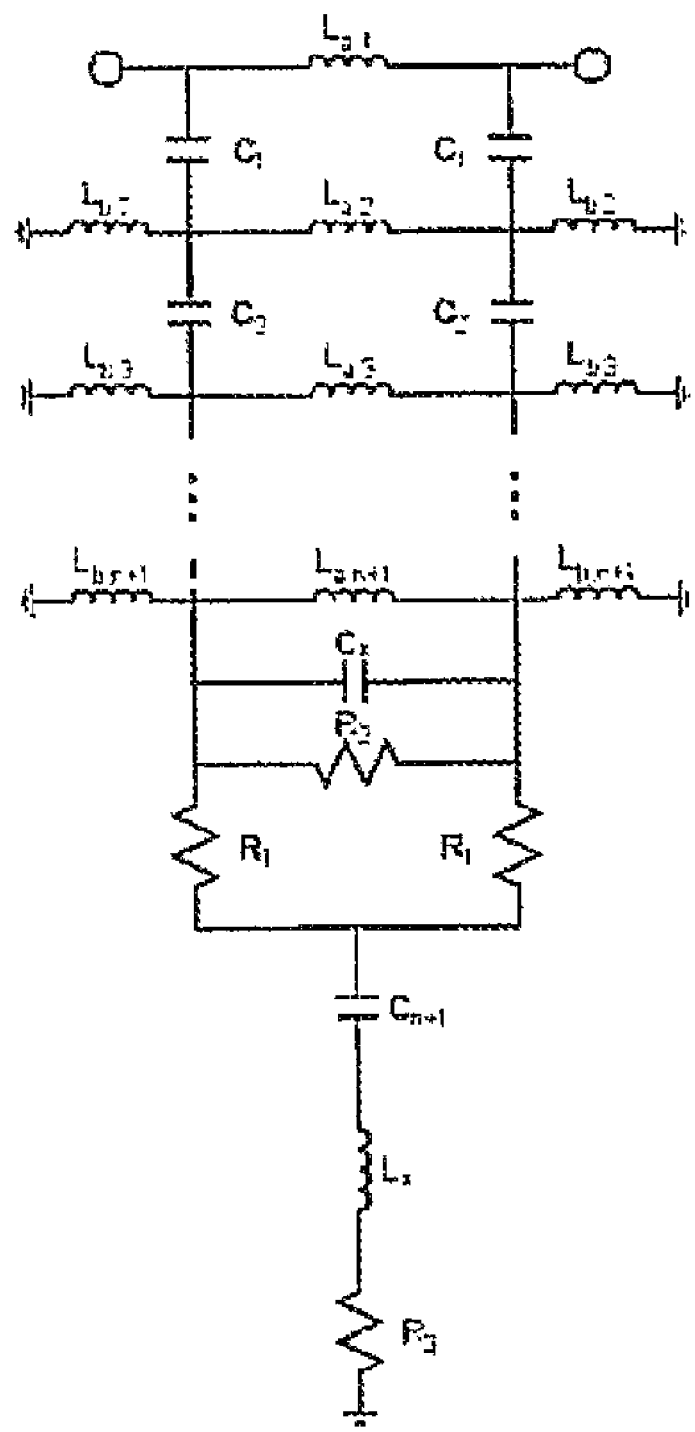
FIG. 5 is a schematic diagram of an expanded $n^{th}$ order low-pass reflectionless filter topology.

FIG. 5 shows another embodiment of a reflectionless low-pass circuit topology. The values of the circuit elements shown in the figure can be constrained in order to satisfy duality conditions as follows:

$$C_1 = \frac{1}{Z_0^2} \cdot \frac{L_{a,1}}{2} \quad (6)$$

$$L_{b,k} = Z_0^2 \cdot C_{k-1} \quad (7)$$

$$C_k = \frac{1}{Z_0^2} \cdot \frac{L_{a,k} L_{b,k}}{L_{a,k} + 2L_{b,k}} \quad (8)$$

$$C_{n+1} = \frac{1}{Z_0^2} \cdot \frac{2L_{a,n+1} L_{b,n+1}}{L_{a,n+1} + 2L_{b,n+1}} \quad (9)$$

$$L_x = Z_0^2 C_x \quad (10)$$

$$R_2 = Z_0^2 \cdot \frac{2R_1}{R_1^2 - Z_0^2 + 2R_1 R_3} \quad (11)$$

In the above equations $Z_0$ is the normalizing impedance. The additional elements may not result in a better filter response, and thus often can be omitted entirely, such that:

$$R_2 = \infty \quad (12)$$

$$R_3 = 0 \quad (13)$$

$$L_{n,k} = \infty \; k > 1 \quad (14)$$

$$L_x = C_x = 0 \quad (15)$$

Figure 6:
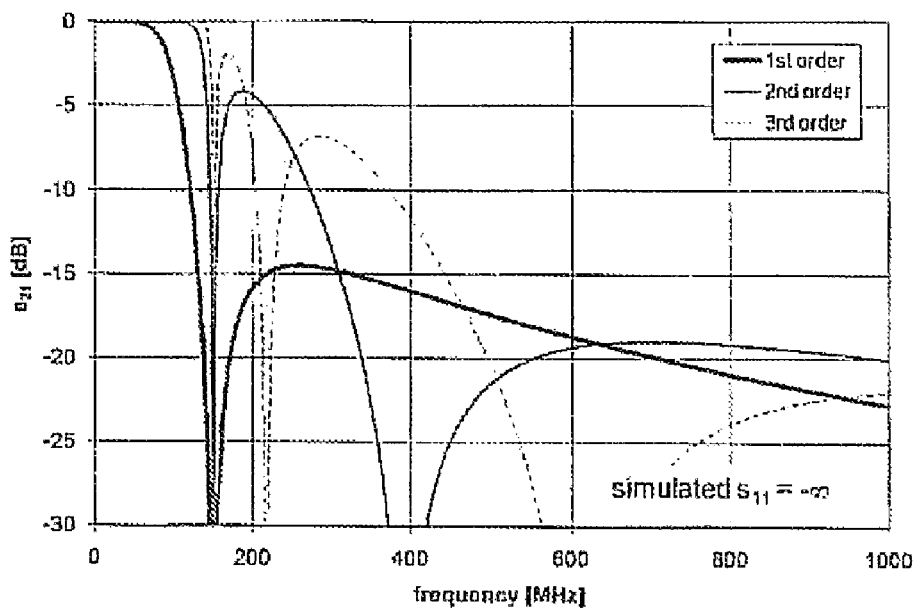
FIG. 6 is a graph showing simulated transfer characteristics for $1^{st}$, $2^{nd}$, and $3^{rd}$ order reflectionless low-pass filters.

FIG. 6 shows simulated responses for reflectionless low-pass filters of the $1^{st}$, $2^{nd}$, and $3^{rd}$ orders. Although higher-order filters can result in shaper cutoff characteristics, they also may develop higher out-of-band peaks. The stop-band peak is just under −14 dB for the first-order filter, −4 dB for the second-order filter, and −2 dB for the third-order filter. As a result, the preferred embodiment uses a first-order filter.

Improved filter characteristics can be achieved by cascading filter sections. Since the filter sections are substantially matched, there is no inherent difficulty in cascading them. In the preferred embodiment, in which the sections are first-order, each section cascaded will provide an additional 14.5 dB of rejection in the stop-band. Unlike conventional filters, the reflectionless filter sections need not be adjacent to one another to work. Thus, they can be distributed throughout the signal path to meet dynamic range and isolation requirements as needed for the application. Furthermore, the filters can be cascaded with at least one of an amplifier, a mixer, a detector, and a conventional filter.

Figure 7:
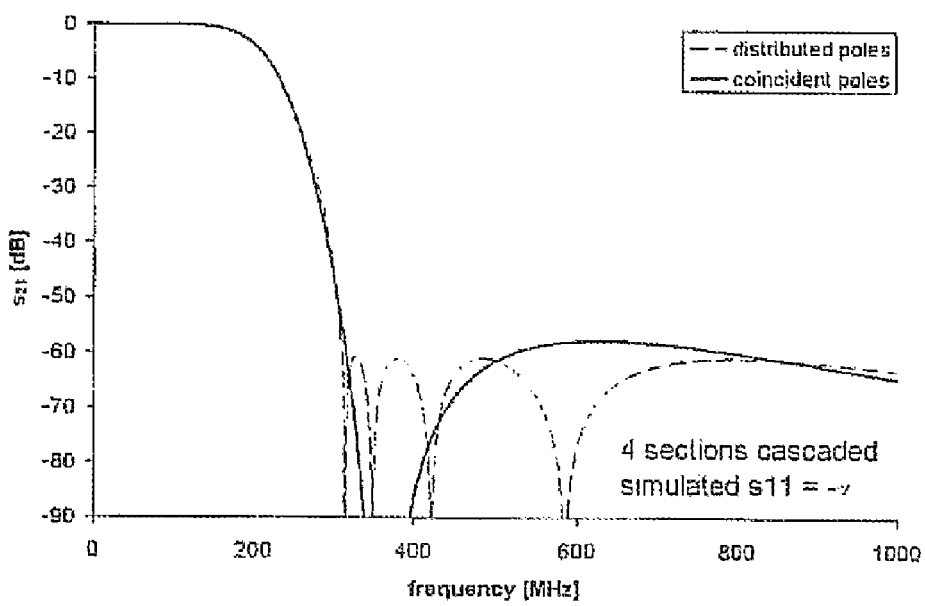
FIG. 7 is a graph showing simulated comparison of cascaded reflectionless low-pass filters with 4 sections in which the poles are either coincident or distributed.

In the embodiment with multiple single-pole sections that are cascaded, the poles all can be coincident or can be distributed. FIG. 7 shows a comparison of these two approaches. Because the slope of the stop-band transfer characteristic beyond the first pole of the single-pole filter is relatively flat, there is not much advantage in spreading out the poles. With four sections in cascade the peak stop-band rejection improves only from 58 dB to 61 dB. At this level the ultimate rejection will depend more on the component tolerance than the tuning of individual sections.

Figure 8:
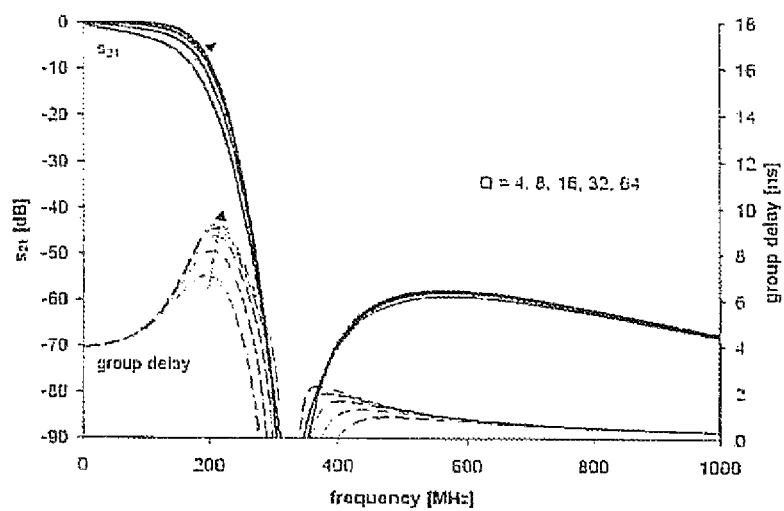
FIG. 8 is a graph showing simulated gain (solid lines) and group delay (dashed lines) for a four-section, reflectionless low-pass filter, with inductor Q varying from 4 to 64.
Figure 9:
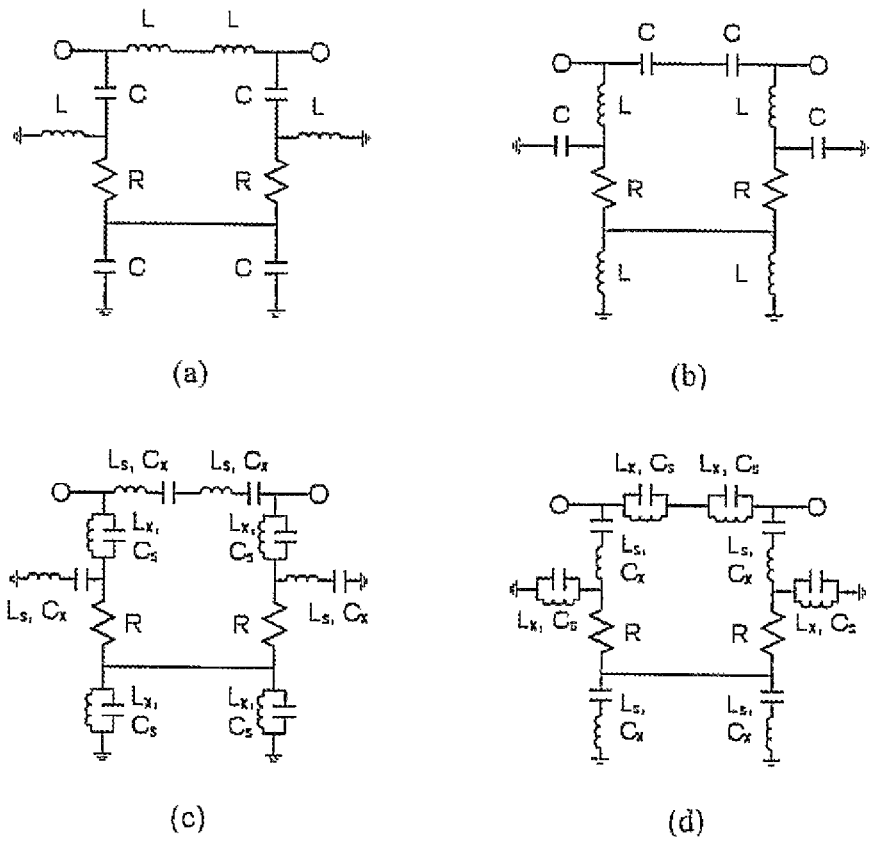
FIG. 9a is a schematic diagram of a first-order low-pass reflectionless filter.
FIG. 9b is a schematic diagram of a first-order high-pass reflectionless filter.
FIG. 9c is a schematic diagram of a first-order band-pass reflectionless filter.
FIG. 9d is a schematic diagram of a first-order band-stop reflectionless filter.
Figure 10:
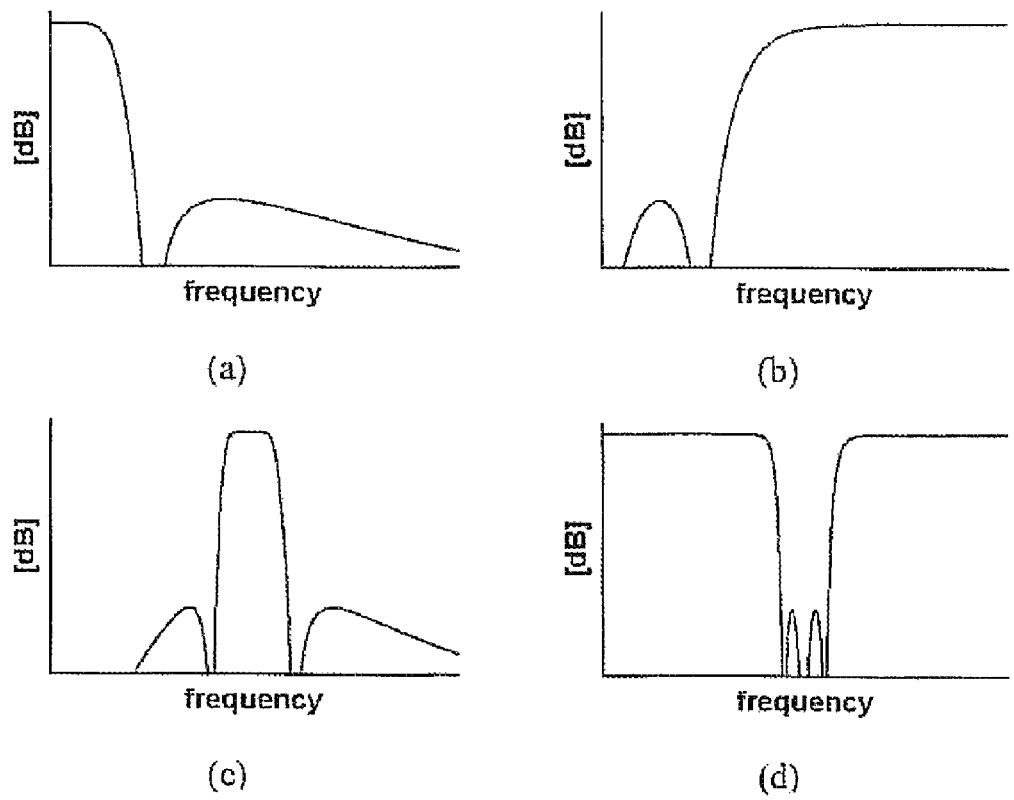
FIGS. 10a-d are graphs of the frequency response of the first-order filters that are shown in FIGS. 9a-d.

Practical filter losses in the pass-band will typically be dominated by the quality factor ("Q") of the inductors. FIG. 8 shows the simulated loss of a four-section low-pass filter with inductor Q factors of 4, 8, 16, 32, and 64, where Q was evaluated at 100 MHz. Note that Q has almost no effect on the stop-band level, and does not impact the pass-band response until Q drops below about 8 using this circuit topology. Group delay is also shown in FIG. 8, having a monotonic characteristic throughout the pass-band very similar to that of maximally flat filters.

In another embodiment, it is noted that after substitution of equations (12) through (15) into equations (6)-(11), the first inductor, $L_{a,1}$, and the last capacitor, $C_{n+1}$, in the low-pass filter topology of FIG. 4 only differ from all the rest by a factor of two. By splitting the first inductor into two series inductors, and the last capacitor into two parallel capacitors, the result is a filter topology in which all the inductors, all the capacitors, and all the resistors are equal, reducing the design problem to a selection of the pole frequency. Similar statements can be made for the high-pass, band-pass, and band-stop filters which can be derived in a manner similar to that describe above. The resulting cascadable reflectionless filter sections are shown in FIGS. 9a-9d. Their corresponding frequency responses are shown in FIGS. 10a-10d.

The design equations for the low-pass and high-pass filters are:

$$L = \frac{Z_0}{\omega_p} \quad (16)$$

$$C = \frac{Y_0}{\omega_p} \quad (17)$$

$$R = Z_0 \quad (18)$$

where L is the inductance of all inductors, C is the capacitance of all capacitors, R is the resistance of all resistors, $\omega_p$ is the pole frequency in radians/s, $Y_0$ is the normalizing admittance, and $Z_0$ is the normalizing capacitance. For band-pass and band-stop filters, which can have two poles each (lower and upper), the design equations are:

$$L_s = \frac{Z_0}{\omega_s} \quad (19)$$

-continued $$L_x = \frac{Z_0}{\omega_x} \quad (20)$$

$$C_s = \frac{Y_0}{\omega_s} \quad (21)$$

$$C_x = \frac{Y_0}{\omega_x} \quad (22)$$

$$R = Z_0 \quad (23)$$

wherein the inductance of the inductors is one of $L_x$ and $L_s$, the capacitance of the capacitors is one of $C_x$ and $C_s$, the resistance of the resistors is R, $Y_0$ is the normalizing admittance, $Z_0$ is the normalizing impedance, and $$\omega_s = \omega_{p,2} - \omega_{p,1} \quad (24)$$

$$\omega_x = \frac{\omega_{p,1}\omega_{p,2}}{\omega_{p,2} - \omega_{p,1}} \quad (25)$$

where $\omega_{p,1}$ and $\omega_{p,2}$ are the lower- and upper-pole frequencies, respectively.

While the embodiments are shown using resistors, capacitors and inductors, any lossless elements or lossy elements can be used. Generally, the filters can just contain "lossy elements" (one possible example of which is resistors) and "lossless elements" (which can be inductors, capacitors, resonators, varactors, and/or transmission lines). Additionally certain elements of the filters can be tunable elements, diodes, and/or tunnel junctions. While the embodiments shown include elements in a certain order, the elements can be in any order. Furthermore, two or more of the same element or two or more different elements can be connected together either in series or in parallel in certain embodiments. Lumped elements, transmission-line equivalents or approximants of lumped elements, transistor-circuit equivalents or approximants of lumped elements, or any combination thereof can be used in the filters. If transistors are used, they can be Field Effect transistors, Bipolar transistors, CMOS transistors, and/or BiCMOS transistors.

The medium used to make the elements can be any known in the art, including but not limited to: coaxial, waveguide, leaded, surface mount, and monolithically-integrated. Each circuit can be superconducting.

The filters can be used in a gain block, in a tunable filter, in a filter bank, in a multiplexer, in an upconverter, in a downconverter, in a transmitter, in a receiver, in a transceiver, or in a signal source.

Figure 11:
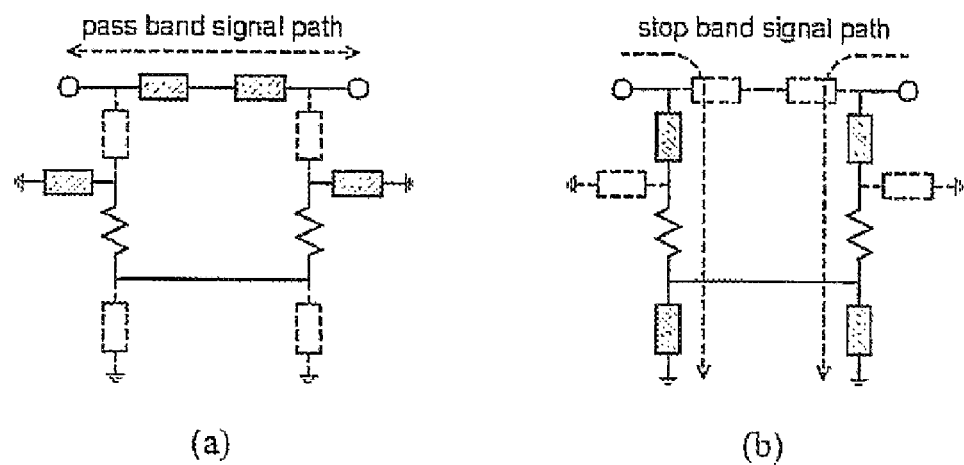
FIG. 11a is a signal path through the circuit when the signal is in the filter's pass band.
FIG. 11b is a signal path through the circuit when the signal is in the filter's stop band.

The path the signal takes through the filters in FIGS. 9a-d is illustrated in FIGS. 11a-b. In this figure, the elements (resistors, inductors, capacitors, and series and shunt combinations) are represented arbitrarily by rectangular impedance elements. The solid rectangles represent relatively low impedances, and the grayed-out elements represent relatively high impedances. When a signal is in the filter's passband, as shown in FIG. 11a, it passes directly through from one port to the other port. When a signal is in the filter's stop-band, as shown in FIG. 11b, it is blocked from passing between the ports, and instead is routed directly to the absorbing resistors in the circuit.

Figure 12:
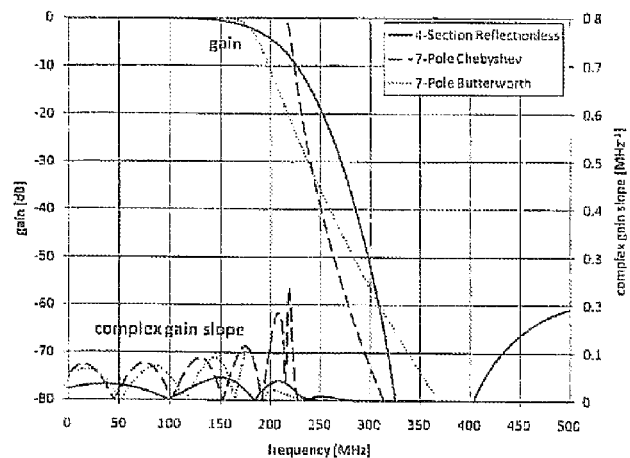
FIG. 12 is a plot of insertion loss and complex gain slope for a 4-section cascaded reflectionless filter as compared to conventional Butterworth and Chebyshev filters.

The reflectionless filter topology has certain other advantages over conventional filters in addition to its non-reflective properties. In FIG. 12, a comparison is made between a 4-section cascaded reflectionless low-pass filter, a 7-pole Chebyshev filter with 0.05 dB ripple, and a 7-pole Butterworth filter. As shown in FIG. 12, the slope of the complex gain is significantly lower than that of Butterworth or Chebyshev filters for the same frequency band, which would result in greater stability and precision of calibration in systems requiring two filters with matched complex gains. It is additionally found that the reflectionless filter requires reactive elements with smaller values than the Butterworth or Chebyshev filters for the same frequency range, easing their implementation at higher frequencies. Further, the reflectionless filter is more tolerant of lossy components, having roughly half the insertion loss of the Chebyshev filter with inductors of the same Q.

The following examples illustrate embodiments of the invention, but should not be viewed as limiting the scope of the invention

EXAMPLES

Figure 13:
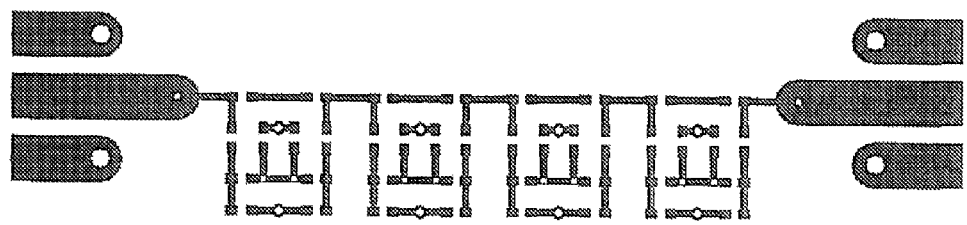
FIG. 13 is a layout of a reflectionless low-pass filter prototype.
Figure 14:
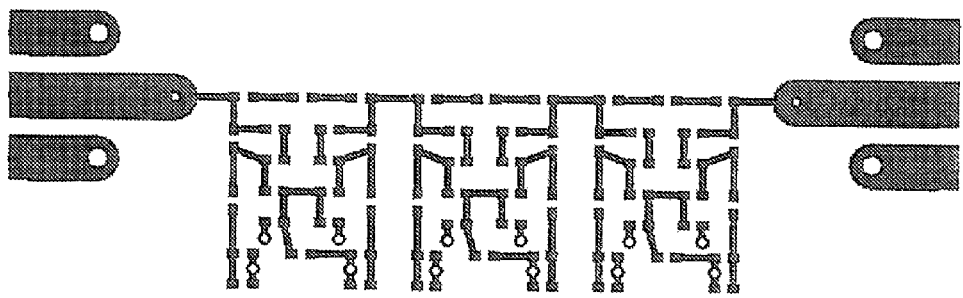
FIG. 14 is a layout of a reflectionless band-pass filter prototype.
Figure 15:
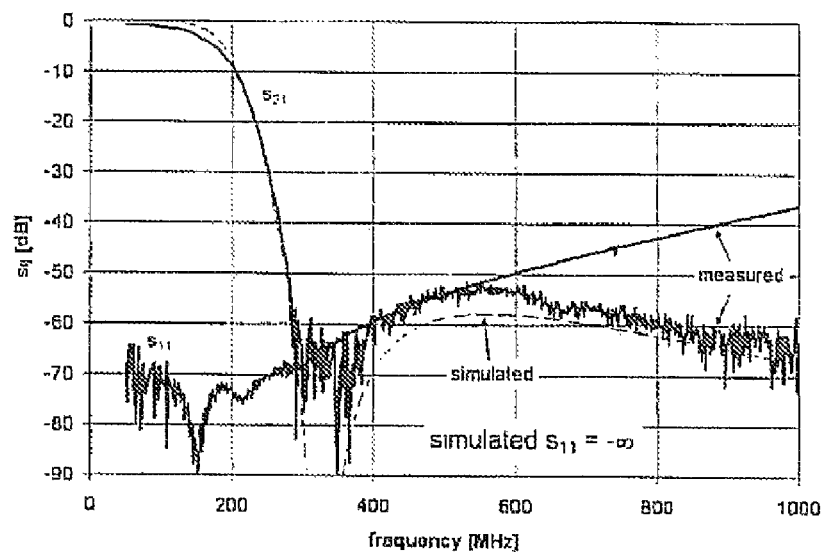
FIG. 15 is a graph of measured v. simulated performance of the reflectionless low-pass filter prototype.
Figure 16:
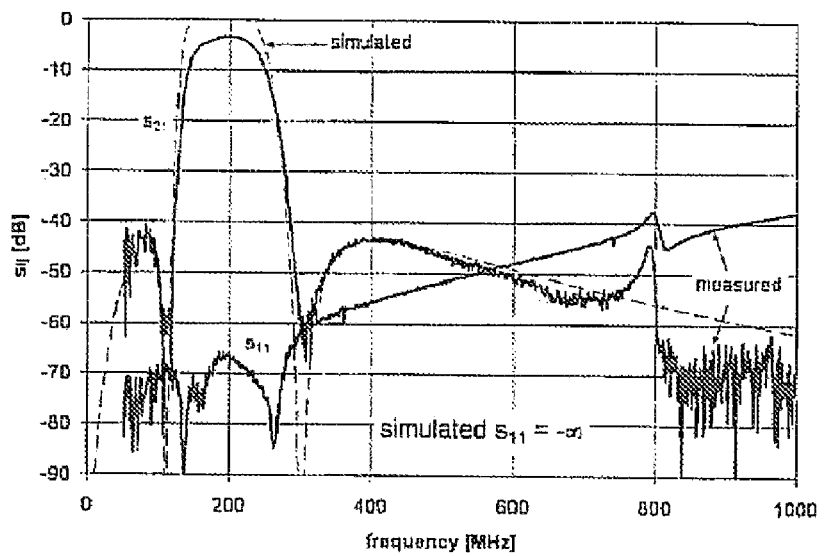
FIG. 16 is a graph of measured v. simulated performance of the reflectionless band-pass filter prototype.

To test some of the representative embodiments, two prototype filters were built and measured using inexpensive, discrete, surface-mount components. The first prototype is a low-pass filter consisting of four cascaded single-pole sections of the filter shown in FIG. 9a, where all four poles are tuned to 325 MHz. The second prototype is a band-pass filter consisting of three first-order sections of the filter shown in FIG. 9c, with the lower and upper poles at 110 MHz and 310 MHz, respectively. Layouts for these prototypes are shown in FIGS. 13 and 14. Plots of their measured and simulated performance are shown in FIGS. 15 and 16.

The data show agreement between measurement and theory, despite the fact that only ideal resistors, inductors, and capacitors were used in the simulations. This shows that very high-quality components, especially inductors, are not needed to implement these filters. The inductors are specified to have a Q of 8, and a tolerance of ±2% and the capacitors have a specified tolerance of ±5%. Since, in certain embodiments, all the inductors in the low-pass filter have the same value, and one of two values in the band-pass filter, the components can all be drawn sequentially from the same lot, so the relative tolerance of the components compared to each other may be better than the absolute tolerance given by the manufacturing process. This is also true of the capacitors and resistors.

In simulation, the reflection coefficient is identically zero, however in practice it depends on the component tolerance. Nonetheless, the measured return loss is better than 65 dB throughout the pass- and transition-bands of both filters, and better than 35 dB over the entire measurement range up to 1 GHz. Likewise, the low-pass filter achieves a peak stop-band rejection of 53 dB, whereas 58 dB was simulated, and the band-pass filter achieves a level of 43 dB, matching the simulation almost exactly. There is a parasitic resonance in the band-pass filter at about 800 MHz, but as this peaks at the −45 dB level, it is unlikely to cause any problem in actual use.

Figure 17:
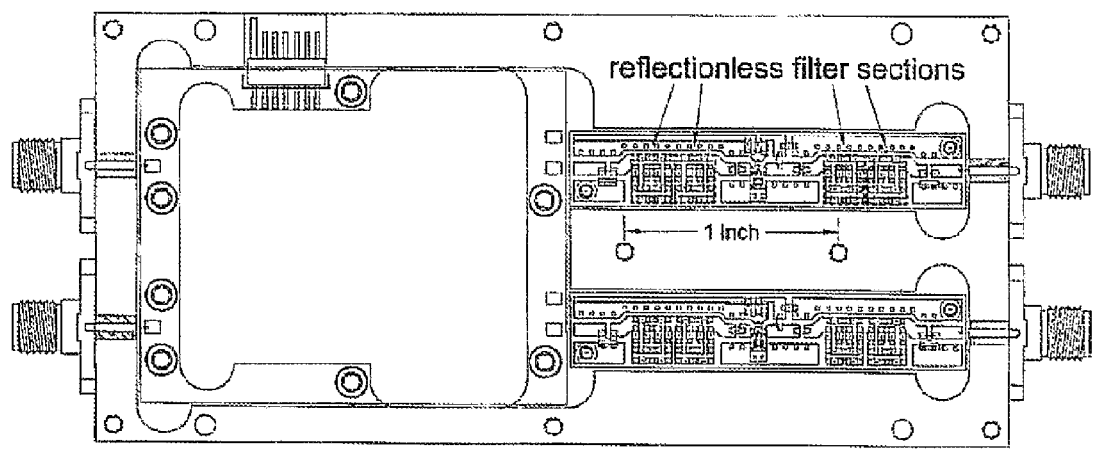
FIG. 17 is a drawing of a downconverter that takes advantage of integrated reflectionless filters.

In another example, reflectionless low-pass filters have been integrated into an L-Band (1200-1700 MHz) downconverter, as shown in FIG. 17. In this embodiment, two reflectionless low-pass filters were used as anti-aliasing filters. Each filter consists of 4 sections of the type shown in FIG. 9a. They have been cascaded with other components such as amplifiers and mixers, and have been distributed throughout the IF path to make the best use out-of-band padding for all components and to maximize dynamic range in the receiver. The filters were implemented using inexpensive surface mount elements. The complex gain match between the filters (when compared to other filter types as indicated in FIG. 12), allows this downconverter to achieve better than 50 dB measured image rejection over a 12 degree Celsius ambient temperature range.

Other embodiments and uses of the invention will be apparent to those skilled in the art from consideration of the specification and practice of the invention disclosed herein. All references cited herein, including all publications, U.S. and foreign patents and patent applications, are specifically and entirely incorporated by reference. It is intended that the specification and examples be considered exemplary only with the true scope and spirit of the invention indicated by the following claims. Furthermore, the term "comprising of" includes the terms "consisting of" and "consisting essentially of."

The invention claimed is:

1. A reflectionless electronic filter comprising:
a symmetric two-port circuit, wherein the symmetry is established by an even-mode equivalent circuit and an odd-mode equivalent circuit when the ports are driven in phase and 180° out of phase, respectively;
wherein the symmetric circuit contains at least one lossless element and at least one lossy element that are arranged such that:
a normalized input impedance of the even-mode equivalent circuit is essentially equal to a normalized input admittance of the odd-mode equivalent circuit, and
a normalized input impedance of the odd-mode equivalent circuit is essentially equal to a normalized input admittance of the even-mode equivalent circuit.

2. The reflectionless filter of claim 1, wherein at least one lossless element is selected from the group consisting of an inductor, a capacitor, a resonator, a transmission line, a varactor, and combinations thereof.

3. The reflectionless filter of claim 2, wherein there are a plurality of inductors of equal inductance and a plurality of capacitors of equal capacitance.

4. The reflectionless filter of claim 1, wherein at least one lossy element is selected from the group consisting of a resistor, a varistor, and combinations thereof.

5. The reflectionless filter of claim 4, wherein there are a plurality of resistors of equal resistance.

6. The reflectionless filter of claim 1, wherein the filter is a band-pass filter or a band-stop filter, and wherein there are a plurality of inductors of one of two inductances, and a plurality of capacitors of one of two capacitances.

7. The reflectionless filter of claim 1, wherein the filter is a low-pass filter or a high-pass filter, and $$L = \frac{Z_0}{\omega_p}$$

$$C = \frac{Y_0}{\omega_p}$$

$$R = Z_0$$

wherein L is the inductance of all inductors, C is the capacitance of all capacitors, R is the resistance of all resistors, $\omega_p$ is the pole frequency in radians/s, $Y_0$ is the normalized input admittance, and $Z_0$ is the normalized input impedance.

8. The reflectionless filter of claim 1, wherein the filter is a band-pass filter or a band-stop filter, has a first pole and a second pole and $$L_s = \frac{Z_0}{\omega_s}$$

$$L_x = \frac{Z_0}{\omega_x}$$

$$C_s = \frac{Y_0}{\omega_s}$$

$$C_x = \frac{Y_0}{\omega_x}$$

$$R = Z_0$$

wherein the inductance of the inductors is one of $L_x$ and $L_s$, the capacitance of the capacitors is one of $C_x$ and $C_s$, the resistance of the resistors is R, $Y_0$ is the normalizing admittance, $Z_0$ is the normalizing impedance, and $$\omega_s = \omega_{p.2} - \omega_{p.1}$$

$$\omega_x = \frac{\omega_{p.1}\omega_{p.2}}{\omega_{p.2} - \omega_{p.1}}$$

wherein $\omega_{p,1}$ and $\omega_{p,2}$ are the first and second pole frequencies, respectively.

9. The reflectionless filter of claim 1, wherein at least one of the circuit elements are tunable.

10. The reflectionless filter of claim 1, wherein the filter is selected from the group of filters including a low-pass filter, a high-pass filter, a band-pass filter, and a band-stop filter.

11. The reflectionless filter of claim 1, wherein the filter is selected from the group consisting of a dual-band filter and a multi-band filter.

12. The reflectionless filter of claim 1, further comprising:
at least one node in each side of the symmetric circuit; and
at least one element between the nodes in each side of the symmetric circuit.

13. The reflectionless filter of claim 1, further comprising additional circuit elements that preserve circuit symmetry and duality of the even-mode and odd-mode equivalent circuits.

14. The reflectionless filter of claim 1, wherein the filter is selected from the group consisting of a first order filter, a second order filter, and higher-order filter.

15. The reflectionless filter of claim 1, wherein the two sides of the symmetric circuit each comprise:
a port node;
a first internal node;
a second internal node;
a lossless element of a first type connecting the port node to a node on the line of symmetry;
a lossless element of a second type connecting the port node to the first internal node;
a lossless element of the first type connecting the first internal node to ground;
a lossy element connecting the first internal node to the second internal node;
a lossless element of the second type connecting the second internal node to ground; and
a direct connection between the second internal node and a node on the line of symmetry.

16. The reflectionless filter of claim 15, wherein the lossy element is a resistor.

17. The reflectionless filter of claim 15, wherein the lossless element of the first type is in inductor and wherein the lossless element of the second type is a capacitor.

18. The reflectionless filter of claim 15, wherein the lossless element of the first type is a capacitor and wherein the lossless element of the second type is an inductor.

19. The reflectionless filter of claim 15, wherein the lossless element of the first type is an inductor and capacitor in parallel and the wherein the lossless element of the second type is an inductor and capacitor in series.

20. The reflectionless filter of claim 15, wherein the lossless element of the first type is an inductor and capacitor in series and wherein the lossless element of the second type is an inductor and capacitor in parallel.

21. The reflectionless filter of claim 1, wherein a plurality of reflectionless filters are cascaded.

22. The reflectionless filter of claim 21, wherein the cascaded filters comprise poles and the poles are one of coincident and distributed.

23. A reflectionless filter of claim 1, wherein the filter is scaled or transformed.

24. The reflectionless filter in claim 1, wherein the circuit elements are selected from the group consisting of transmission-line equivalents of lumped elements and transistor-circuit equivalents of lumped elements.

25. The reflectionless filter in claim 24, wherein the transistors are at least one of Field Effect, Bipolar, CMOS, and BiCMOS.

26. The reflectionless filter in claim 1, wherein at least one circuit element is selected from the group consisting of a diode and a tunnel junction.

27. The reflectionless filter in claim 1, wherein the physical medium of the circuit elements is one of coaxial, waveguide, leaded, and surface mount.

28. The reflectionless filter in claim 1, wherein at least one circuit element is selected from the group consisting of monolithically integrated and superconducting.

29. The reflectionless filter of claim 1, wherein the filter is cascaded with at least one of additional reflectionless filters, an amplifier, a mixer, a detector, and a conventional filter.

30. The reflectionless filter of claim 1, wherein the filter is used in at least one of a gain block, a tunable filter, a filter bank, a multiplexer, an upconverter, a downconverter, a transmitter, a receiver, a transceiver, and a signal source.

31. A method of designing a reflectionless electronic filter comprising the steps of:
provinding a symmetric two-port circuit, wherein the symmetry is established by an even-mode equivalent circuit and an odd-mode equivalent circuit when the ports are driven in phase and 180° out of phase, respectively;
constraining the symmetric circuit so that a normalized input impedance of the even-mode equivalent circuit is essentially equal to a normalized input admittance of the odd-mode equivalent circuit and a normalized input impedance of the odd-mode equivalent circuit is essentially equal to a normalized input admittance of the even-mode equivalent circuit.

32. The method of claim 31, further comprising:
constraining the even-mode equivalent circuit topology to be one of the group of filters including high-pass, low-pass, band-pass, band-stop, dual-band, and multi-band, wherein one port is terminated;
constraining the odd-mode equivalent circuit topology to be the dual of the even-mode circuit topology;
adjusting the even- and odd-mode equivalent circuit topologies to satisfy symmetry conditions while maintaining the circuit behavior; and
adjusting the values of the circuit elements to satisfy symmetry and duality conditions.

33. The method of claim 32, wherein the adjustments to the even- and odd-mode equivalent circuit topologies comprise at least one of:
adding elements in the even-mode equivalent circuit between the circuit nodes and the line of symmetry;
changing the grounding of circuit elements in the odd-mode equivalent circuit between one of absolute and virtual to the other of absolute and virtual;
changing the order of elements in series;
connecting circuit nodes in the even-mode equivalent circuit to the line of symmetry; and
adding elements in the odd-mode equivalent circuit between absolute ground and virtual ground.

34. The method of claim 31, further comprising adding new elements between the circuit nodes and nodes on the line of symmetry.

35. The method of claim 31, further comprising adding additional elements that preserve the circuit symmetry and duality of the even-mode and odd-mode equivalent circuits.

36. The method of claim 31, further comprising assigning values to at least one of the circuit elements which result in at least one transmission pole at a desired location.

37. The method of claim 31, further comprising cascading a plurality of reflectionless filters.

38. The method of claim 37, further comprising setting the pole locations to be one of coincident and distributed.

39. The method of claim 31, further comprising selecting physical components which closely approximate the circuit behavior of at least one of the circuit elements in the reflectionless filter topology.

40. The method of claim 39, wherein the physical components are one of lumped-elements, transmission lines, transistors, coaxial, waveguide, leaded, and surface-mount.

41. The method of claim 39, wherein at least one of the physical components is selected from the group consisting of monolithically integrated and superconducting.

* * * * *